(12) United States Patent
Stark (10) Patent No.: US 11,172,294 B2
(45) Date of Patent: Nov. 9, 2021

(54) AUDIO DEVICE WITH SPEECH-BASED AUDIO SIGNAL PROCESSING

(71) Applicant: Bose Corporation, Framingham, MA (US)

(72) Inventor: Michael Stark, Acton, MA (US)

(73) Assignee: Bose Corporation, Framingham, MA (US)

( * ) Notice: Subject to any disclaimer, the term of this patent is extended or adjusted under 35 U.S.C. 154(b) by 23 days.

(21) Appl. No.: 16/728,382

(22) Filed: Dec. 27, 2019

(65) Prior Publication Data

US 2021/0201926 A1    Jul. 1, 2021

(51) Int. Cl.
*H04R 3/04* (2006.01)
*G10L 21/0364* (2013.01)
*G10L 25/78* (2013.01)

(52) U.S. Cl.
CPC ............ *H04R 3/04* (2013.01); *G10L 21/0364* (2013.01); *G10L 25/78* (2013.01)

(58) Field of Classification Search
CPC ......... G06F 3/165; G10L 15/22; G10L 19/26; G10L 21/0208; G10L 21/0364; G10L 25/78; G10L 15/142; G10L 17/00; G10L 21/0332; G10L 25/90; H04N 21/812; H04N 5/04; H04R 3/04; H04R 3/007; H04R 25/505; H04R 27/00; G10K 11/17854; H03G 3/3052
USPC .......... 381/312, 17, 103, 121; 704/205, 208, 704/270, 270.1, 275, 200.1, 233
See application file for complete search history.

(56) References Cited

U.S. PATENT DOCUMENTS

| | | | |
|---|---|---|---|
| 8,620,006 B2 | 12/2013 | Berardi et al. | |
| 8,731,912 B1 * | 5/2014 | Tickner | ................. G10L 15/22 704/208 |
| 9,131,326 B2 | 9/2015 | Gaalaas | |
| 9,578,436 B2 | 2/2017 | Scheirer et al. | |
| 10,154,353 B2 * | 12/2018 | Jensen | ................. H04R 25/554 |
| 10,210,860 B1 * | 2/2019 | Ward | ....................... G10L 15/30 |
| 10,225,654 B1 * | 3/2019 | Lindemann | ............ H04R 3/007 |
| 10,319,373 B2 * | 6/2019 | Nagao | ................... G10L 15/144 |
| 10,362,422 B2 * | 7/2019 | Borne | ...................... H04S 3/006 |
| 10,504,539 B2 * | 12/2019 | Kaskari | .................. G10L 15/22 |
| 10,726,849 B2 * | 7/2020 | Lesso | ...................... G10L 17/20 |
| 10,754,428 B1 * | 8/2020 | Parise | ..................... H04R 3/04 |
| 2007/0078645 A1 * | 4/2007 | Niemisto | ........... G10L 21/0208 704/200.1 |

(Continued)

FOREIGN PATENT DOCUMENTS

WO    2013/150340 A1    10/2013

OTHER PUBLICATIONS

The International Search Report and the Written Opinion of the International Searching Authority dated May 21, 2021 for PCT Application No. PCT/US2020/066565.

*Primary Examiner* — Gerald Gauthier
(74) *Attorney, Agent, or Firm* — Brian M. Dingman; Dingman IP Law, PC (57) ABSTRACT

An audio device with an electro-acoustic transducer and a processor that is configured to determine if input audio signals are speech-based, and if the input audio signals are determined to be speech-based apply speech dynamic range compression to the input audio signals, to develop revised audio signals. The revised audio signals are provided to the transducer.

16 Claims, 6 Drawing Sheets

(56) References Cited

U.S. PATENT DOCUMENTS

| | | | |
|---|---|---|---|
| 2009/0299742 A1* | 12/2009 | Toman | G10L 21/0208 704/233 |
| 2010/0106507 A1* | 4/2010 | Muesch | H04R 25/356 704/270.1 |
| 2011/0044476 A1* | 2/2011 | Burlingame | H04R 17/00 381/121 |
| 2014/0314238 A1* | 10/2014 | Usher | H04R 3/04 381/17 |
| 2014/0358552 A1* | 12/2014 | Xu | G06F 1/3215 704/275 |
| 2015/0222990 A1* | 8/2015 | Hansen | H04R 3/04 381/103 |
| 2015/0281853 A1* | 10/2015 | Eisner | H04R 25/505 381/312 |
| 2015/0302867 A1* | 10/2015 | Tomlin | G10L 25/78 704/270 |
| 2015/0310874 A1* | 10/2015 | Fromel | G10L 21/02 704/205 |
| 2016/0189707 A1* | 6/2016 | Donjon | H04W 88/02 704/205 |
| 2016/0293174 A1* | 10/2016 | Atti | G10L 19/26 |
| 2017/0047080 A1* | 2/2017 | Shiga | G10L 21/0232 |
| 2018/0091913 A1* | 3/2018 | Hartung | H03G 3/32 |
| 2018/0277133 A1* | 9/2018 | Deetz | H04M 3/568 |
| 2020/0014355 A1* | 1/2020 | Henderson | H04N 21/8106 |
| 2020/0058317 A1 | 2/2020 | Gaalaas | |
| 2021/0099799 A1* | 4/2021 | Saux | H04R 3/005 |
| 2021/0201926 A1* | 7/2021 | Stark | G10L 25/78 |

* cited by examiner

AUDIO DEVICE WITH SPEECH-BASED AUDIO SIGNAL PROCESSING

BACKGROUND

This disclosure relates to an audio device that is configured to process speech-based audio signals.

Speech-based audio programming signals, such as podcasts, are often not compressed as much as music or broadcast radio. Speech-based audio signals thus may have a wider dynamic range than those for music or broadcast radio. In noisy environments, the user may need to increase the volume in order to hear quieter segments. But this can make louder segments too loud. Speech-based audio signals, or other audio signals with a wide dynamic range, thus can require frequent user volume control.

SUMMARY

All examples and features mentioned below can be combined in any technically possible way.

In one aspect, a computer program product having a non-transitory computer-readable medium including computer program logic encoded thereon that, when performed on an audio device that is configured to play audio signals over an electro-acoustic transducer, causes the audio device to determine if input audio signals are speech-based. If the input audio signals are determined to be speech-based speech dynamic range compression is applied to the input audio signals to develop revised audio signals. The revised audio signals are provided to the transducer.

Some examples include one of the above and/or below features, or any combination thereof. In some examples if the input audio signals are determined to be speech-based the computer program product further causes the audio device to apply at least one of speech static equalization or speech dynamic equalization to the input audio signals. In an example if the input audio signals are not determined to be speech-based the computer program product causes the audio device to apply at least one of non-speech static equalization, non-speech dynamic equalization, or non-speech dynamic range compression to the input audio signals. In an example if the input audio signals are not determined to be speech-based the computer program product causes the audio device to apply non-speech static equalization, non-speech dynamic equalization, and non-speech dynamic range compression to the input audio signals. In an example speech static equalization has less low frequency compensation and more high frequency compensation than does non-speech static equalization. In an example speech dynamic equalization has less low frequency compensation than does non-speech dynamic equalization.

Some examples include one of the above and/or below features, or any combination thereof. In some examples the computer program product causes the audio device to apply a mix of non-speech static equalization, speech static equalization, non-speech dynamic equalization, speech dynamic equalization, non-speech dynamic range compression, and speech dynamic range compression to the input audio signals. In an example the mixing accomplishes a ratio of the non-speech static equalization to the speech static equalization, a ratio of the non-speech dynamic equalization to the speech dynamic equalization, and a ratio of the non-speech dynamic range compression to the speech dynamic range compression. In an example the ratio is based on a confidence of a decision as to whether or not the input audio signals are speech-based. In an example the computer program product further causes the audio device to apply different speech dynamic range compression coefficients to different frequency bands of the input audio signals.

Some examples include one of the above and/or below features, or any combination thereof. In some examples the computer program product causes the audio device to determine if the input audio signals are speech-based using at least one of a machine-learned algorithm, statistical analysis, meta-data associated with the input audio signals, or input from a user interface. In an example the user interface is associated with a smartphone.

Some examples include one of the above and/or below features, or any combination thereof. In some examples if the input audio signals are not determined to be speech-based the computer program product causes the audio device to apply non-speech dynamic range compression to the input audio signals. In an example speech dynamic range compression has faster time constants as compared to time constants of non-speech dynamic range compression. In an example the speech dynamic range compression and the non-speech dynamic range compression each comprise different values for a dynamic range compression parameter. In an example the computer program product further causes the audio device to apply a mix of the non-speech dynamic range compression and the speech dynamic range compression to the input audio signals. In an example the mixing accomplishes a ratio of the non-speech dynamic range compression to the speech dynamic range compression. In an example the ratio is based on a confidence of a decision as to whether or not the input audio signals are speech-based.

In another aspect an audio device includes an electro-acoustic transducer and a processor that is configured to determine if input audio signals are speech-based, and if the input audio signals are determined to be speech-based apply speech dynamic range compression to the input audio signals, to develop revised audio signals that are provided to the transducer. In an example, if the input audio signals are determined to be speech-based the processor is further configured to apply speech static equalization and speech dynamic equalization to the input audio signals, and if the input audio signals are not determined to be speech-based the processor is further configured to apply non-speech static equalization, non-speech dynamic equalization, and non-speech dynamic range compression to the input audio signals.

DETAILED DESCRIPTION

In some examples herein, audio devices are configured to determine if input audio signals are speech based, or if the audio signals are not compressed as much as music or broadcast radio. In such cases different processing is applied to the signals as compared to the processing for music-based or pre-compressed signals, before the audio is played over an electro-acoustic transducer. In some examples the processing applied to speech-based signals includes dynamic range compression. In some examples this processing also includes different static and dynamic equalization (EQ) tuning as compared to the static and dynamic EQ tuning that is applied to music-based or pre-compressed signals. In some examples the processing can automatically pan between the tuned settings for either type of audio source in order to better optimize the user experience. In some examples a user interface (UI) is configured to allow the user to switch between music and speech mode tunings. In an example the UI includes an enable/disable switch in an application, for example an app that is configured to run on a smartphone.

Figure 1:
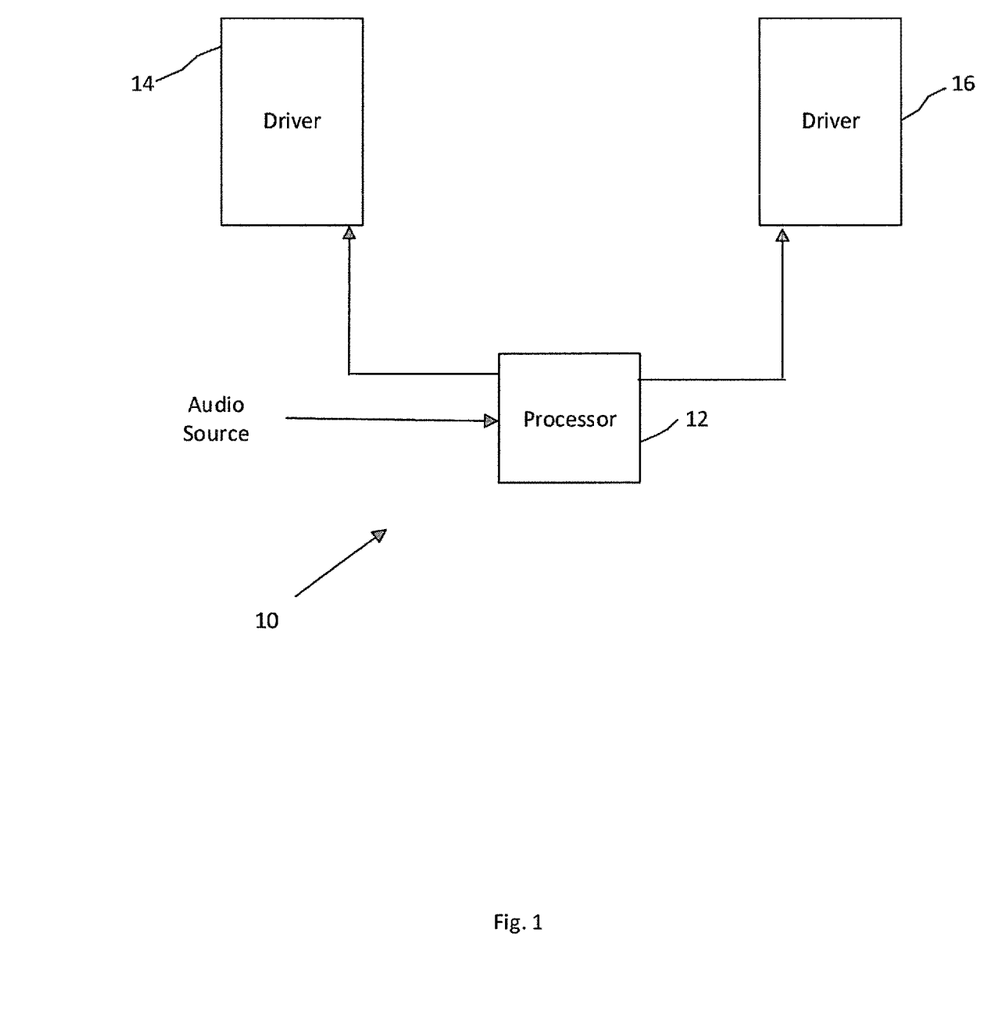
FIG. 1 is a schematic diagram of an audio device with speech-based audio signal processing.

FIG. 1 schematically illustrates exemplary audio device 10 that is used to accomplish the subject speech-based audio signal processing. Audio device 10 is configured to receive input audio signals, which are processed by processor 12. The processed audio signals are then sent to audio drivers (transducers) 14 and 16. Note that other aspects of audio device 10, such as receivers, transmitters, amplifiers and other processing, are not included in FIG. 1 for the sake of clarity. Also, audio devices can have one or more drivers.

Audio systems can be configured to apply a tuning to input audio signals that is designed for compressed signals of the type that is typical for music or broadcast radio. This tuning typically includes a fixed or static EQ that does not change over time and represents an audio EQ tuning that is designed to make the audio device output a desired sound, for example to match a target response. The tuning typically also includes a dynamic EQ, which accomplishes a time-varying EQ to compensate for perceived loudness at different levels. In some examples another aspect of tuning includes limiters that are configured to protect the drivers from physical damage during loud playback levels, as well as make the device sound as good as it can in those conditions. Static EQ, dynamic EQ and limiters are well known in the field and so are not further described herein.

Figure 2A:
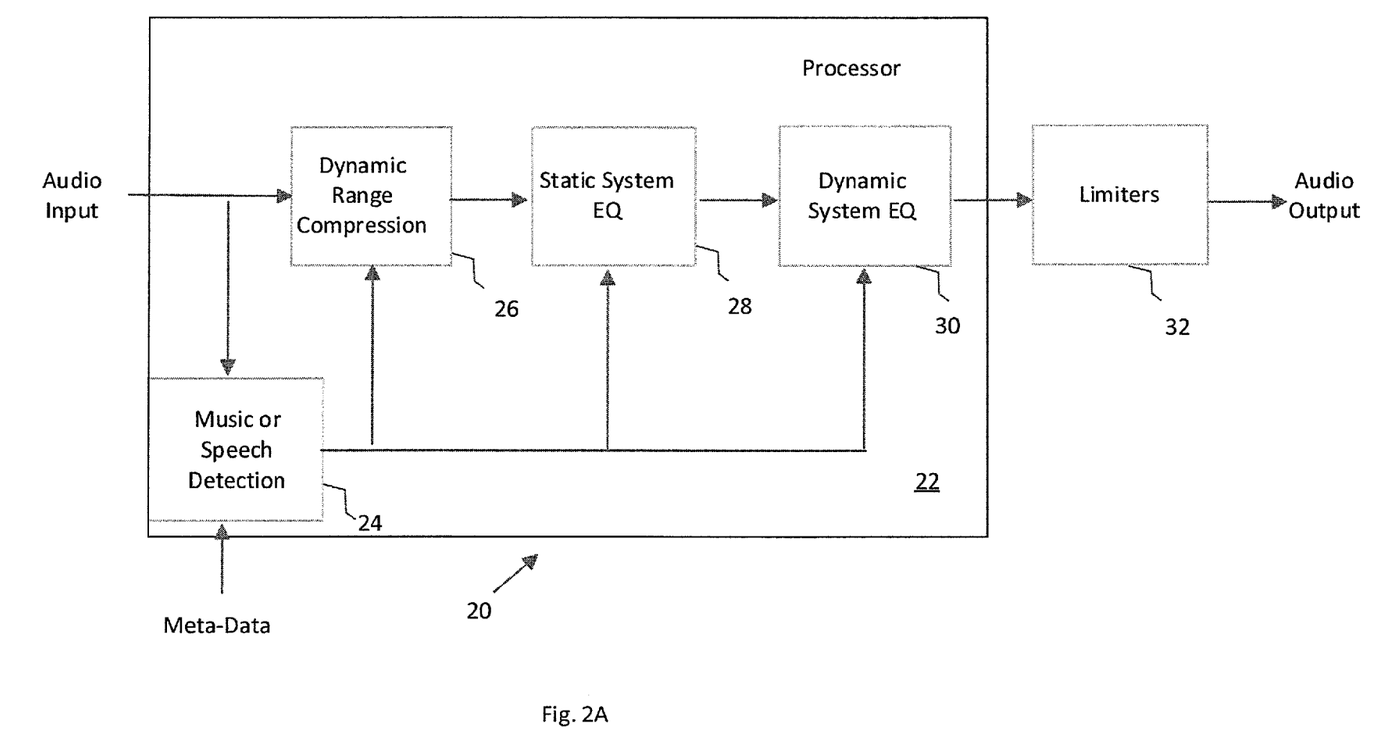
FIG. 2A is a schematic diagram of an example of an audio device with different audio signal tunings for music-based and speech-based input.

FIG. 2A is a schematic diagram of an example of an audio device 20 of this disclosure that is configured to accomplish different audio signal tunings for music-based and speech-based audio input, using processor 22. The audio signal processing accomplished using processor 22 is exemplary of processing that can vary based on whether music or speech is playing. Music or speech detection function 24 describes processing that is configured to make a decision as to whether the input audio is music-based (e.g., compressed as music signals typically are) or whether the input audio is speech-based (e.g., it is uncompressed or compressed in a manner that differs from normal music compression).

In some examples, function 24 is based on a machine-learned algorithm, statistical analysis, or meta-data coming from the audio stream. In an example, a machine-learned algorithm is an algorithm which has been trained to analyze a stereo music source while being told whether the source is speech or not speech. This training will arrange the parameters of a neural network. Once trained, the algorithm will make a prediction of whether the current audio source is speech or not speech, and some confidence level of its response. In an example, a statistical analysis of the incoming audio signal would include an analysis of the stereo vs. mono content, or correlation between left and right channels of a musical spectrum, as well as a spectral band analysis of the audio. For example, speech content will typically have very little audio content below ~80 Hz, which is roughly the low frequency end of male speech. Mono speech content will tend to have very little uncorrelated content between the left and right audio channels. Most often, speech channels tend to be panned to the center of a stereo sound stage, that is, equal energy in the left and right channels. The correlation of the left and right channels therefore will be very high. Some podcasts may have two primary speakers in a discussion format, and in this case it may be possible that each voice may be panned left-of-center and right-of-center in order to present a more spacious stereo image, and increase the apparent stereo separation between the speakers, making them easier to understand. However, they are unlikely to be panned fully hard-left and hard-right, as this might seem over-exaggerated and un-natural to many listeners when only one voice is speaking, especially if listening over headphones. In contrast, most musical content will have multiple instruments and/or voices recorded in a stereo fashion, that is, panned to specific locations around a left-right soundstage, to enhance the stereophonic dimensionality of the recording. Analysis of the incoming audio signal could point to the type of processing (speech/music) that would be most beneficial. In an example, incoming metadata may also be used to determine the type of audio program. For example, ID3 is a metadata container typically used for MP3 compressed music files. A metadata flag (e.g., speech, or music) could be used to specify which type of processing should be used, or used in conjunction with the previously-mentioned analyses.

In some examples the differentiation between speech and music is based on whether the signal is stereo (for music) or mono (for speech). Or, processor 22 can base the decision on the frequency range or other time-based characteristics of the input signals. For example, speech typically includes mainly sounds in the speech frequency range of about 300 Hz to about 3,000 Hz and music typically has a broader range. Also, music often has a greater range of frequency change over time than speech. As another example, speech may have hard sounds as compared to music. These are non-limiting examples of a frequency v. time analysis of the audio signals that can be used to make the speech/music decision.

In another example function 24 is accomplished under user control. A button on a user interface to the device (or on a controller for the device such as an app on a smartphone) could be enabled to apply the music or speech tuning. Such a user interface would also allow the user to override an automatic control should such be desirable. For example if the music or speech has abnormal characteristics it may be misinterpreted by an automated function and the user may want to override the decision made by an automated aspect of function 24.

The output of function 24 then feeds its decision into one, two, or all three audio signal processing functions 26, 28, and 30, that in an example are each configured to accomplish different tunings depending on whether the input is music-based or speech-based. Functions 26, 28, and 30 are in this example each applied to the input audio signals, but their order as depicted in FIG. 2A is not important to the results. In some examples, functions 26, 28, and 30 each have two settings (i.e., processing that is applied to the input): one setting is for music-based inputs and the other setting is for speech-based inputs. The setting for each function is automatically selected based on the output from function 24. The limiters 32 would typically not change depending on the input signal type and so are depicted separately from processor 22, although limiter functionality may indeed be accomplished by processor 22, or a different processor, or other audio device components.

Dynamic range compression function 26 in one example accomplishes dynamic range compression on input speech-based signals that typically are un-compressed, or are compressed differently than are music signals. Dynamic range compression is a known audio signal processing technique. Dynamic range compression can be used to determine an expected instantaneous sound pressure level (SPL) based on the input signal level and the volume setting, and adjust the input signal level to reach a target SPL level. In the present case, in some examples in which speech is determined to be the active source, function 26 would use faster time constants for attack and release times than are used in music-based signal compression; this would help increase the volume of quiet speech more quickly than would be the case with slower time constants. Because the statistics of music signals are quite different from speech, the faster time constants used to maintain speech-only at a consistent level tend to cause audible artifacts in music. Musical signals are combinations of longer-duration musical elements, such as sustained instrumental notes or voices, and more-transient elements, like drums. The transient elements can cause audible "pumping" or modulation in the sustained musical elements. The time constants would help to quickly raise the output to the target SPL level in order to catch transients in the input signal. In some examples dynamic range compression is applied to speech but not music.

Static system EQ function 28 in one example can be primarily used to correct for any anomalies in the raw acoustical response of the playback system, including transducers and enclosure effects. On top of this, there is often an EQ shape applied to produce an overall pleasing sound quality. The equalization of a known-speech signal may differ from that of a known-music signal. Music is often mastered to sound best when played over a full-range loudspeaker system, and may be equalized to emphasize the lower midrange and bass frequency ranges, often below 200 Hz. For a speech signal, on the other hand, sound quality may be improved by de-emphasizing this lower frequency range, to avoid muddiness and boominess, primarily in male speech. For example, some microphones can imply a low frequency emphasis on speech, particularly males, which may negatively affect sound quality if played back over a sound system with a boosted low midrange region. Also, a so-called "presence" boost in the range of 3-6 kHz may benefit the intelligibility of speech by emphasizing clarity in the upper harmonics and fricatives of the vocal. But, for music, this may cause the entire playback to sound a bit harsh.

Dynamic system EQ function 30 in one example is configured to apply different signal equalization functions to different frequency bands of the input audio signals. For example, the human ear can be less sensitive to bass at low SPL. Accordingly, when low frequency sounds (which can be below about 400 Hz) are played at low SPL they can be difficult to perceive. Function 30 may thus boost the SPL of such low frequency signals that are below a threshold SPL of about 85 dB, assuming that the intended listening level of 85 dB SPL is a "target" level used by mastering engineers. Therefore as the playback level drops below 85 dB SPL, the perceived equalization will not be representative of the mastering engineer's intent. For signals consisting of speech, 85 dBSPL would be a very loud level for mastering, as most conversational speech is in the range of 60-70 dB SPL. Therefore, if the system determines that the current signal is, say 60 dB SPL, the amount of boost required to make music sound as-intended is likely to be more than that required to make speech sound appropriate. For example, music may require 5 dB of low frequency boost, whereas speech may require 0 dB. Knowing which type of signal is present allows an appropriate choice of boost.

Figure 2B:
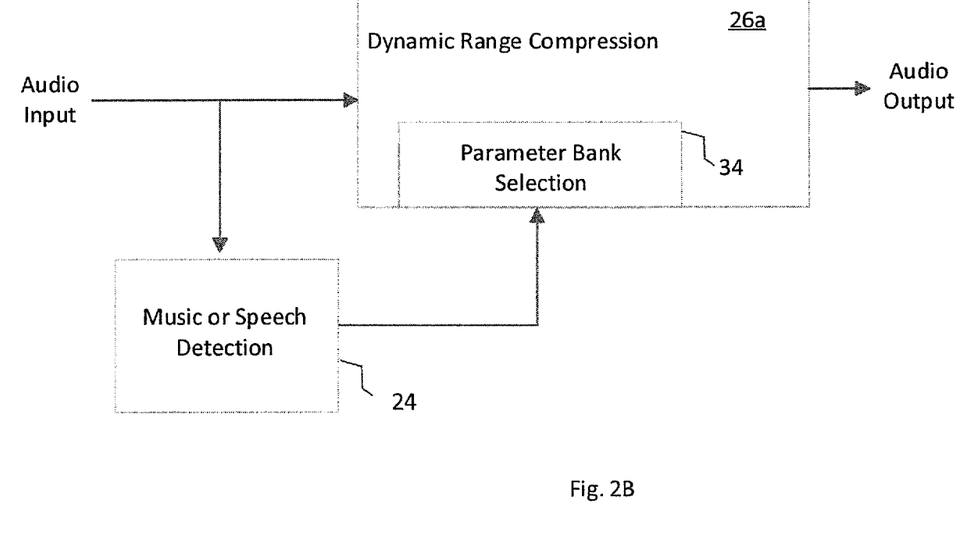
FIG. 2B is a schematic diagram of an example of dynamic range compression.

FIG. 2B is a schematic diagram of an example of dynamic range compression function 26a, which is an exemplary implementation of dynamic range compression function 26, FIG. 2A. In one example, function 26a implements a bank 34 comprising two distinct sets of values for one or more of the dynamic range compression parameters. One of the two sets would be selected and applied to the audio signals based on the music/speech decision detection function 24. In some examples, switching between the two sets of values would be tailored to help avoid or decrease audible artifacts due to switching. Based on the output value of function 24, say, ranging between the values 0 and 1, an algorithm could dynamically sweep between the two values of the parameter sets in the calculations for compression. For example, if function 24 determines the signal is music (and therefore outputs "0"), it would use the attack time constant appropriate for music; say, 50 msec. If function 24 determines the signal is purely speech (and therefore outputs "1"), it would use the attack time constant appropriate for speech, say, 1 msec. If the output of function 24 is uncertain of the signal type, or if it was transitioning between speech and music, an algorithm could interpolate between the two time constant values, such that the algorithm is applying an appropriate attack rate for the situation.

Figure 2C:
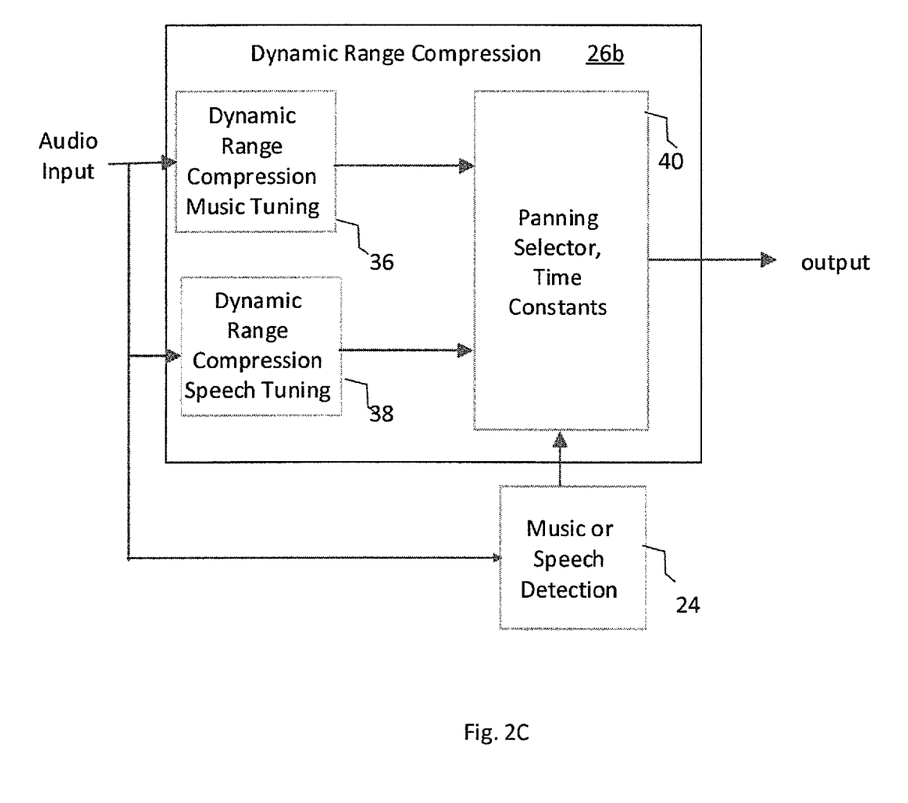
FIG. 2C is a schematic diagram of an example of dynamic range compression.

FIG. 2C is a schematic diagram of another example of dynamic range compression function 26b, which is an exemplary implementation of dynamic range compression function 26, FIG. 2A. In one example, function 26b comprises distinct dynamic range compression tunings for music and speech (functions 36 and 38, respectively). The outputs of both tunings (which are processed in parallel) are provided to panning selector and time constants function 40. These would help to buffer any rapid changes between the music and speech states. For example, changing tunings too quickly between the two states may cause audible artifacts; a goal is to tune these time constants such that the listener does not perceive things changing, but just gets the benefit of the appropriate tuning. The particular panning or mixing of the two tunings can be based on the music/speech detection function 24. As with the dynamic range compression 26a, FIG. 2B, panning between the two tunings can be tailored to avoid or decrease audible artifacts.

Figure 2D:
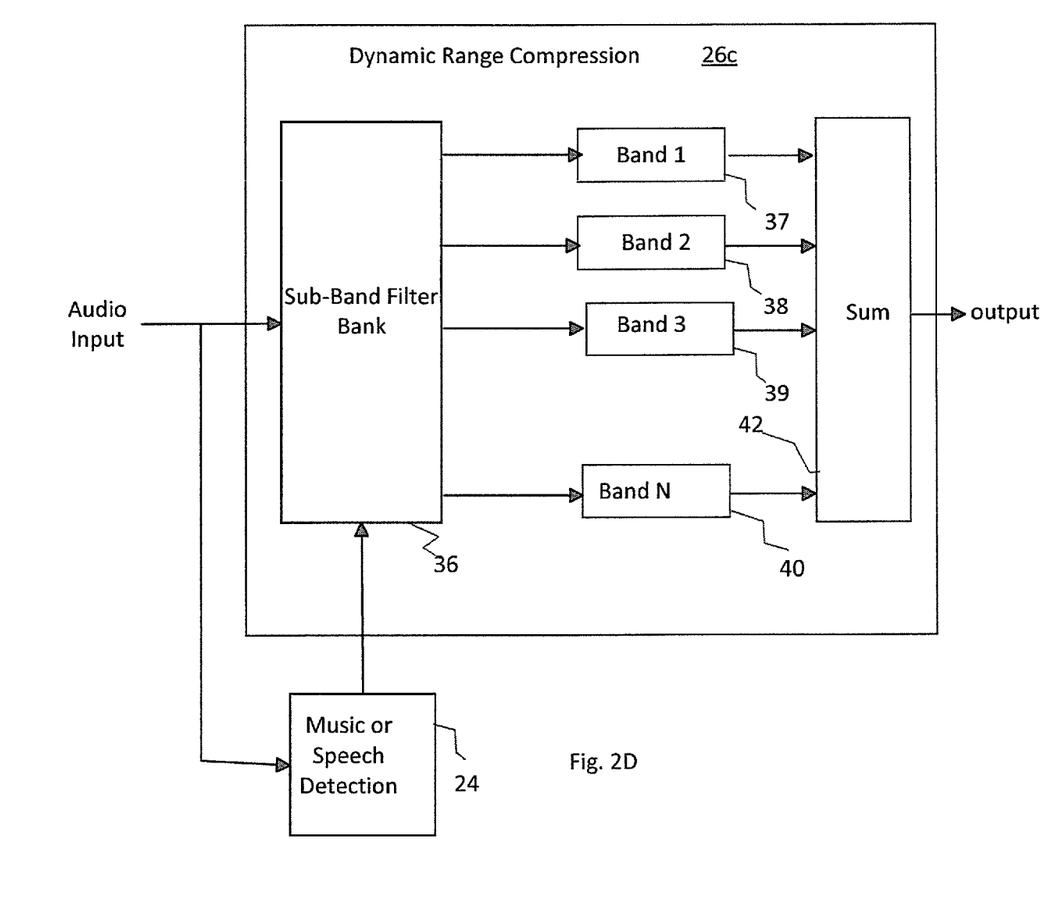
FIG. 2D is a schematic diagram of an example of dynamic range compression.

FIG. 2D is a schematic diagram of another example of dynamic range compression function 26c, which is an exemplary implementation of dynamic range compression function 26, FIG. 2A. Sub-band filter bank function 36 is configured to apply different tunings to different frequency bands of the input audio signals, labelled bands 1-N (outputs 37-40, respectively). Each band may have one tuning for music and a different tuning for speech. The selection of one of the two tunings can be based on the music/speech detection function 24. The compressed signals in all of the bands are summed, function 42, and then outputted for further processing, as described above.

Figure 3:
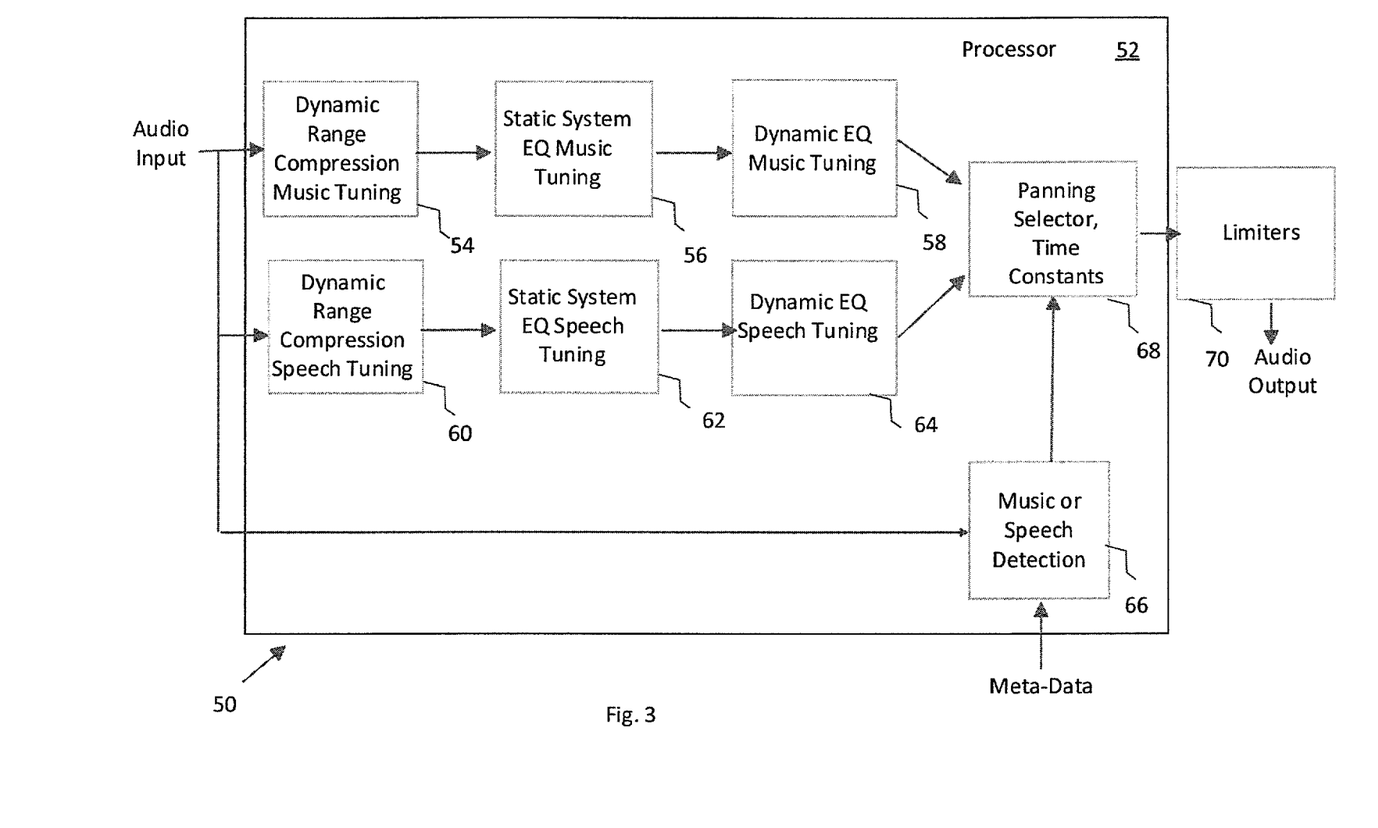
FIG. 3 is a schematic diagram of an example of an audio device with different audio signal tunings for music-based and speech-based input.

FIG. 3 is a schematic diagram of another example of an audio device 50 with different audio signal tunings for music-based and speech-based audio inputs. In this case, processor 52 implements parallel processing of the input signals for music processing and for speech processing. Dynamic range compression function 54, static EQ tuning function 56, and dynamic EQ tuning function 58 apply music processing parameters, and at the same time dynamic range compression function 60, static EQ tuning function 62, and dynamic EQ tuning function 64 apply speech processing parameters. Both differently-processed signals are provided to panning selector 68, which is inputted with the output of music or speech detection function 66, and functions like panning selector 40, FIG. 2C. The selected or mixed signals are provided to limiters 70 and outputted to the drivers.

A selection of the processing functionalities for music and/or speech among the different processing schemes depicted in FIGS. 2A, 2B, 2C, 2D, and 3, can be based on factors such as the desired outcome and the processing and memory in the particular audio device that are available for use in implementing the speech-based processing.

Elements of figures are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawing.

Examples of the devices and methods described herein comprise computer components and computer-implemented steps that will be apparent to those skilled in the art. For example, it should be understood by one of skill in the art that the computer-implemented steps such as instructions relating to processing may be stored as computer-executable instructions on a computer-readable medium such as, for example, floppy disks, hard disks, optical disks, flash ROMS, nonvolatile ROM, RAM, and other now-existing or future-developed storage. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other examples are within the scope of the following claims.

What is claimed is:

1. A computer program product having a non-transitory computer-readable medium including computer program logic encoded thereon that, when performed on an audio device that is configured to play audio signals over an electro-acoustic transducer, causes the audio device to:
   determine if input audio signals are speech-based;
   if the input audio signals are determined to be speech-based, apply speech dynamic range compression and at least one of speech static equalization or speech dynamic equalization to the input audio signals, to develop revised audio signals;
   if the input audio signals are not determined to be speech-based, apply non-speech static equalization, non-speech dynamic equalization, and non-speech dynamic range compression to the input audio signals, to develop revised audio signals; and
   provide the revised audio signals to the transducer.

2. The computer program product of claim 1, wherein speech static equalization has less low frequency compensation and more high frequency compensation than does non-speech static equalization.

3. The computer program product of claim 1, wherein speech dynamic equalization has less low frequency compensation than does non-speech dynamic equalization.

4. The computer program product of claim 1, wherein the computer program product causes the audio device to apply a mix of non-speech static equalization, speech static equalization, non-speech dynamic equalization, speech dynamic equalization, non-speech dynamic range compression, and speech dynamic range compression to the input audio signals.

5. The computer program product of claim 4, wherein the mixing accomplishes a ratio of the non-speech static equalization to the speech static equalization, a ratio of the non-speech dynamic equalization to the speech dynamic equalization, and a ratio of the non-speech dynamic range compression to the speech dynamic range compression.

6. The computer program product of claim 5, wherein the ratio is based on a confidence of a decision as to whether or not the input audio signals are speech-based.

7. The computer program product of claim 1, wherein the computer program product causes the audio device to determine if the input audio signals are speech-based using at least one of a machine-learned algorithm, statistical analysis, meta-data associated with the input audio signals, or input from a user interface.

8. The computer program product of claim 7, wherein the user interface is associated with a smartphone.

9. The computer program product of claim 1, wherein speech dynamic range compression has faster time constants as compared to time constants of non-speech dynamic range compression.

10. The computer program product of claim 1, wherein speech dynamic range compression and non-speech dynamic range compression each comprise different values for a dynamic range compression parameter.

11. The computer program product of claim 1, wherein the computer program product further causes the audio device to apply a mix of non-speech dynamic range compression and speech dynamic range compression to the input audio signals.

12. The computer program product of claim 11, wherein the mixing accomplishes a ratio of non-speech dynamic range compression to speech dynamic range compression.

13. The computer program product of claim 12, wherein the ratio is based on a confidence of a decision as to whether or not the input audio signals are speech-based.

14. The computer program product of claim 1, wherein the computer program product further causes the audio device to apply different speech dynamic range compression coefficients to different frequency bands of the input audio signals.

15. An audio device, comprising:
an electro-acoustic transducer; and
a processor that is configured to:
  determine if input audio signals are speech-based, and if the input audio signals are determined to be speech-based apply speech dynamic range compression, speech static equalization and speech dynamic equalization to the input audio signals, to develop revised audio signals;
  if the input audio signals are not determined to be speech-based, to apply non-speech static equalization, non-speech dynamic equalization, and non-speech dynamic range compression to the input audio signals, to develop revised audio signals; and
  provide the revised audio signals to the transducer.

16. A computer program product having a non-transitory computer-readable medium including computer program logic encoded thereon that, when performed on an audio device that is configured to play audio signals over an electro-acoustic transducer, causes the audio device to: determine if input audio signals are speech-based or if the input audio signals are music-based; in response to the determination, apply a mix of non-speech static equalization, speech static equalization, non-speech dynamic equalization, speech dynamic equalization, non-speech dynamic range compression, and speech dynamic range compression to the input audio signals, to develop revised audio signals; and provide the revised audio signals to the transducer.

* * * * *